United States Patent [19]

Feuerbaum

[11] Patent Number: 4,486,660
[45] Date of Patent: Dec. 4, 1984

[54] ELECTRON BEAM TESTING DEVICE FOR STROBOSCOPIC MEASUREMENT OF HIGH-FREQUENCY, PERIODIC EVENTS

[75] Inventor: Hans-Peter Feuerbaum, Munich, Fed. Rep. of Germany

[73] Assignee: Siemens Aktiengesellschaft, Berlin & Munich, Fed. Rep. of Germany

[21] Appl. No.: 284,828

[22] Filed: Jul. 20, 1981

[30] Foreign Application Priority Data

Sep. 29, 1980 [DE] Fed. Rep. of Germany ....... 3036708

[51] Int. Cl.³ ............................................. H01J 37/28
[52] U.S. Cl. .................................................... 250/310
[58] Field of Search ........................................ 250/310

[56] References Cited

U.S. PATENT DOCUMENTS 3,535,516 10/1970 Munakata ............................ 250/310
3,628,012 12/1971 Plows et al. ........................ 250/310

OTHER PUBLICATIONS

Hosokawa et al., "Gigaherz Stroboscopy . . . ", *Rev. Sci. Instrum.*, 49(9), Sep. 1978, pp. 1293-1299.
Feuerbaum et al., "Signal Processing . . . ", *Microcircuit Engineering*, 1981.
"IEEE J. of Solid-State Circuits", vol. SC-14, No. 2, Apr. 1979, pp. 471-481, Article entitled Electron-Beam Testing Of VLSI Circuits", by Wolfgang et al.
"Beam Chopper for Subnanosecond Pulses in Scanning Electron Microscopy", Feuerbaum et al., J. Phys. E: Sci. Instrum., vol. 11, 1978, pp. 529-532.
"On-Wafer Defect Classification of LSI-Circuits Using a Modified SEM", Fazekas et al., Scanning Electron Microscopy, 1978, vol. 1, pp. 754 and 801-806.
Digital Circuit Testers publication of Hewlett-Packard Microprocessor Lab, Model 5036A.
Princeton Applied Research Operating and Service Manual, Model 162 Boxcar Integrator, 1976.

*Primary Examiner*—Alfred E. Smith
*Assistant Examiner*—Jack I. Berman
*Attorney, Agent, or Firm*—Hill, Van Santen, Steadman & Simpson

[57] ABSTRACT

An electron beam testing device is disclosed for stroboscopic measurement of high-frequency periodic events in a measuring object. A scanning electron beam microscope is employed with a beam suppression system. A detector senses secondary electrons emitted from the measuring object. A boxcar integrator is provided having an internal gate circuit, phase control circuit and signal processing circuit. A delay is inserted between the phase control circuit and gate circuit so as to delay activation of the gate circuit in accordance with a transit time of electron means emanating from the scanning electron microscope.

1 Claim, 1 Drawing Figure

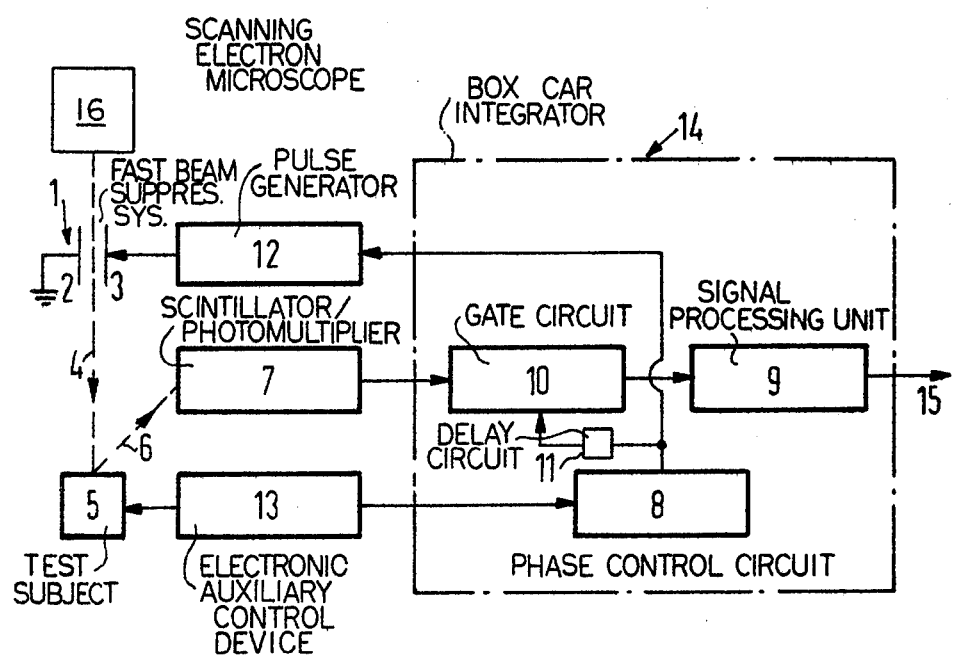

ELECTRON BEAM TESTING DEVICE FOR STROBOSCOPIC MEASUREMENT OF HIGH-FREQUENCY, PERIODIC EVENTS

BACKGROUND OF THE INVENTION

The invention relates to an electron beam measuring or testing device for stroboscopic measurement or testing of high-frequency, periodic events. Electron beam testing of electron beams is utilized to measure or test in non-contact manner in environments where the use of a contact probe is undesirable due to capacitive loading and accessibility considerations.

High-frequency periodic events can be stroboscopically measured in integrated circuits with an electron probe. Serving as the check or analysis probe is a focused electron beam which is directed at the subject being tested or measured. Due to the interaction between electrons and the solid body, secondary electrons among other things are released which can be employed for imaging an object. These secondary electrons also carry information concerning the electrical potential at the location of incidence. Upon exploitation of the stroboscopic effect, measuring subjects which function with a high nominal frequency can also be quasi-statically imaged to provide a potential contrast. To this end, the measuring subjet to be examined is targeted with cyclically repeating signals and imaged in a scanning electron microscope. The electron beam is only switched on once in each cycle for a brief time, i.e., the measuring subject or specimen is observed only during a specific phase. Thus, the imaging is a snapshot of the rapidly functioning probe. The point in time at which the electron beam is turned on can be selected at random within the cycle. A slow-motion representation of the switching operations is possible by means of slowly shifting the phase. The on-time duration of the electron beam can be reduced down to the picosecond (ps) range, i.e., the chronological resolution of this imaging method lies in the ps range. The electron pulses are generated with the assistance of a beam suppression or blanking system well known to those skilled in this art.

The potential at the point of incidence of the primary electrons is determined with the assistance of a spectrometer from the energy of the secondary electrons which are released in pulse-like fashion. For this purpose, the signal of the secondary electrons which are to pass through the spectrometer are amplified in a scintillator/photomultiplier combination and are further processed after integration in a preamplifier. The arrangement requires:

(1) a phase control with which the phase of the electron pulses is set, and
(2) a preamplifier which can process pulse-shaped signals without overdriving.

Since commercial devices are not available with the required capacity, in electron beam measuring devices for stroboscopic measurement of high-frequency periodic events as previously known, the various components had to be developed (See E. Wolfgang et al, "Electron Beam Testing of VLSI Circuits," IEEE J. of Solid-State Circuits, Vol. SC-14, No. 2, April 1979, pp. 471–481, incorporated herein by reference). In detail, the following components were accordingly constructed:

(a) A delay generator (Hewlett-Packard) was modified for the phase control.
(b) A special electronics was developed for the drive of the delay generator.
(c) A preamplifier was constructed for the signal processing which, together with a controlled-gain amplifier, makes a potential measurement possible.

Despite considerable effort, however, the device does not meet recent demands with respect to capacity, reliability and manipulation.

SUMMARY OF THE INVENTION

An object of the invention is to provide an efficient and reliable electron beam testing device for stroboscopic measurement of high-frequency periodic events which is simple to manipulate.

This object is inventively achieved by means of a modified boxcar integrator for phase control and signal processing. Expediently, the boxcar integrator exhibits a delay line between the phase control unit and gate circuit.

In contrast to the known arrangement, the invention offers the following advantages:

(a) The signal processing is insensitive to disruptions of the beam suppression system and is independent of the scanning frequency.
(b) The synchronization ensues automatically.
(c) The signal-to-noise ratio is improved.
(d) Drive of the inventive arrangement via a computer is simplified.
(e) The cost saving amounts to 50%.

BRIEF DESCRIPTION OF THE DRAWING

The drawing FIGURE illustrates in block diagram format an inventive arrangement for stroboscopic potential measurements with an electron beam measuring device.

DESCRIPTION OF THE PREFERRRED EMBODIMENTS

An inventive arrangement for stroboscopic potential measurements with an electron beam measuring device is illustrated in the drawing FIGURE. A known electron beam measuring device as previously described can be modified according to the invention to produce the inventive arrangement. The basic unit forms a modified scanning electron microscope 16 with a fast beam suppression system well known in the art. This beam suppression or blanking system 1 exhibits two deflection structures 2, 3. In order to be able to stroboscopically measure high-frequency periodic events at the measuring subject 5, an electron beam 4 of primary electrons is pulsed synchronously with the event so that it strikes the measuring subject 5 only in a specific phase of the high-frequency periodic event. The potential in this phase of the high-frequency periodic event is determined with the assistance of a spectrometer from the energy of the secondary electrons 6 emitted in pulse-shaped fashion. For this purpose, the signal of the secondary electrons 6 which must pass through the spectrometer is amplified in a scintillator/photomultiplier combination 7 and is further processed in a modified boxcar integrator 14. Accordingly, it assumes the control of the phase and the signal processing. A boxcar integrator is an amplifier which samples the high-frequency signals with a time window (gate) according to the sampling principle whereby the same phase of the signal is continually sampled. By employment of a boxcar integrator, the potential in one phase is repeatedly measured and integrated. As a result of the integration, the employment of a boxcar integrator supplies an improved signal-to-noise ratio. After conclusion of the integration, the phase is shifted. By so doing, a periodic signal course can be sampled.

The boxcar integrator 14 has a phase control unit 8, a signal processing unit 9, and a gate circuit 10. After amplification in the scintillator/photomultiplier combination 7, the signal of the secondary electrons 6 arrives at the input of the gate circuit 10. The values measured in the measuring subject 5 at a specific phase of the high-frequency periodic event are integrated in the signal processing unit 9 and are subsequently amplified. The following change must be carried out in the boxcar integrator 14 for employment in electron beam measurement or testing technology: a delay circuit 11 (approximately 150 nanosecond (ns)) is built in between the phase control unit 8 and the gate circuit 10. Without delay, the phase control unit 8 drives the pulse generator 12 of the beam suppression system 1. The signal of the released secondary electrons 6, as a result of the transit time of the primary electrons 4, arrives in delayed fashion at the input of the gate circuit 10. At the same time, when the signal of the released secondary electrons 6 appears at the input of the gate circuit 10, the gate circuit is driven via the built-in delay circuit 11 in such manner that the signal of the secondary electrons 6 is amplified. The boxcar integrator 14 supplies a signal 15 which is proportional to the level of the signal of the released secondary electrons 6. The overall arrangement also exhibits an electronic auxilliary control device 13 for the drive of the measuring subject 5 and for the drive of the phase control unit 8. The device Model 162 of the PAR (Princeton Applied Research Corporation, Princeton, N.J.) company was employed as the boxcar integrator 14 having the above-described gate circuit, signal processing unit, and phase control unit therein.

In the previously cited article "Electron-Beam Testing of VLSI Circuits", IEEE of Solid-State Circuits, 471–481, in FIG. 5 of this reference, there are described the peripheral accessories required for the stroboscopic voltage contrast mode and for the sampling mode according to this invention. In reference 20 of this cited article, (H. P. Feuerbaum et al, "Beam Chopper For Subnano-Second Pulses In Scanning Electron Microscopy", J. Phys. E: Sci Instr., Vol. 11, 1978, 529–532), an appropriate beam chopper system (pulse generator 12 and suppression system 1) as well as an appropriate electronic device 13 are described.

In a preferred embodiment, as the electron microscope 16, a modified ETEC autoscan scanning electron microscope may be employed with a large-area specimen chamber in which a printed-circuit board has been placed on the x, y stage (P. Fazekas et al, "On-Wafer Defect Classification of LSI-Circuits Using A Modified Sem", SEM/1978/801–806), the test subject 5 under test is inserted in a socket on this board, which is implemented as a personality card for each test subject (such as an integrated circuit) to be inspected. Coaxial cables run from the printed-circuit board through coaxial vacuum feedthroughs to a second printed-circuit board, which is likewise provided with line drivers. Connected to the second circuit board is a HP Microprocessor-lab 5036A as the control device 13 which drives the test subject 5 under test. Located above the microprocessor under test is the electron spectrometer for voltage measurements (H. P. Feuerbaum "VLSI Testing Using The Electron Probe", SEM/1979/I, SEM INC, AMF O-Hare, IL6066 (1979), 285–296).

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A circuit for phase control and signal processing for use with an electron beam testing device for stroboscopic measurement of high-frequency periodic events at a measuring object resulting from driving the testing device with a high-frequency generating means, said testing device including a scanning electron beam microscope having a beam suppression or blanking system, detector means for detecting secondary electrons emitted from the measuring object when the measuring object is struck by an electron beam from the microscope, and pulse means for controlling the beam suppression system, comprising:

a boxcar integrator means having a gate circuit means, signal processing means, and phase control means driven by and synchronized with said high-frequency generating means, said gate circuit means being connected to receive output signals from the detector means and which provides an individual gated output signal by use of a gate window at each output signal to said signal processing means whenever each of the output signals is received, the signal processing means then integrating the individual output signals, and said phase control means being connected for simultaneously synchronizing said pulse means and said gate circuit means with said high frequency generating means at a specific phase;

a delay means being provided between the phase control means and gate circuit means; and said delay means delaying an output from the phase control means by a time interval related to a transit time of the electron beam of the electron microscope, whereby the modified boxcar integrator for phase control and signal processing causes automatic simultaneous synchronization between electron beam pulsing and signal processing.

* * * * *